United States Patent [19]
Besenfelder et al.

[11] 4,053,738
[45] Oct. 11, 1977

[54] PROGRAMMABLE DATA ENVELOPE DETECTOR

[75] Inventors: Edward Roald Besenfelder, Phoenix; Steve Garner Cantrell, Glendale, both of Ariz.

[73] Assignee: Honeywell Information Systems Inc., Phoenix, Ariz.

[21] Appl. No.: 727,309

[22] Filed: Sept. 27, 1976

[51] Int. Cl.² .............................................. G06M 3/02
[52] U.S. Cl. .......................... 235/92 PB; 235/92 PE; 235/92 DP; 235/92 FQ; 235/92 CA; 235/92 R; 360/40
[58] Field of Search ........ 235/92 FQ, 92 DP, 92 CA, 235/92 PB, 92 CC, 92 EV, 92 PE; 360/40

[56] References Cited
U.S. PATENT DOCUMENTS

| | | | |
|---|---|---|---|
| 3,581,066 | 5/1971 | Maure et al. | 235/92 CC |
| 3,714,645 | 1/1973 | Sivertson | 235/92 FQ |
| 3,824,378 | 7/1974 | Johnson et al. | 235/92 CA |
| 3,956,616 | 5/1976 | Knollenberg | 235/92 CA |
| 3,981,440 | 9/1976 | Richardson | 235/92 PK |

*Primary Examiner*—Joseph M. Thesz
*Attorney, Agent, or Firm*—Walter A. Nielsen; William W. Holloway, Jr.

[57] ABSTRACT

A programmable data envelope detector indicates the presence of phase encoded data being transmitted to or received from a data storage medium. The detector generates an output signal at a predetermined time after detecting the presence of data and continues to provide such output signal for a predetermined time after detecting the end of data. The detector comprises a data pulse detector, three-count up-down counter, two multicount four-bit up-down counters, a microprogrammable control store and decoder, a compare circuit, and a latch circuit. The time periods at which the latch circuit generates the output signal are different depending upon the nature of the data transfer operation, such time periods corresponding to different microinstructions in the control store.

2 Claims, 2 Drawing Figures

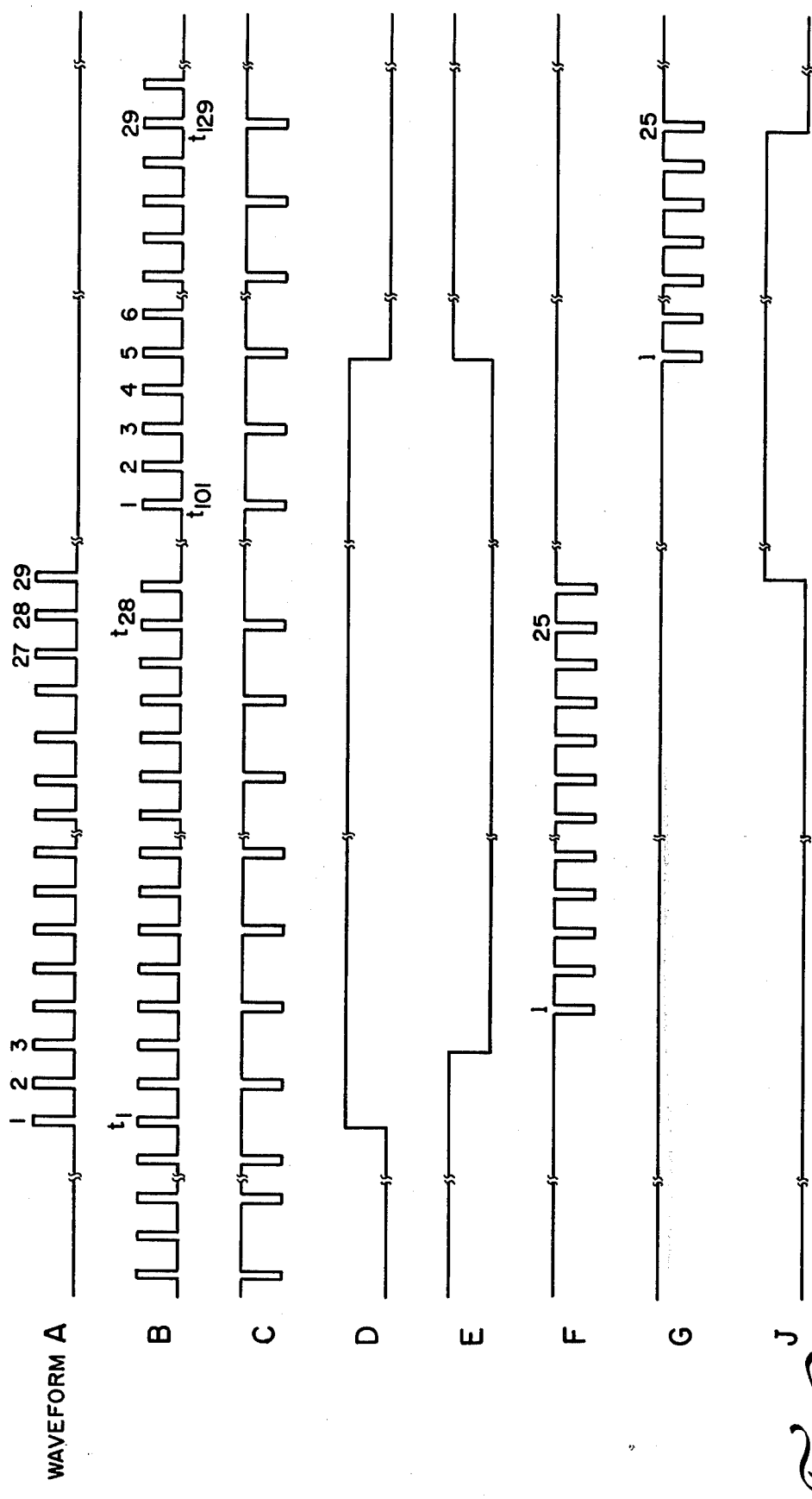

PROGRAMMABLE DATA ENVELOPE DETECTOR

BACKGROUND OF THE INVENTION

The invention relates generally to apparatus for detecting the presence of phase encoded data and, more particularly, to apparatus for detecting the presence of phase encoded data in a data storage subsystem and employing a magnetic recording medium.

In contemporary data processing systems data is stored on magnetic tape or magnetic disks for retrieval and use at a later time. It is important that large quantities of data be stored as compactly as possible to minimize the number of reels of tape or number of disks used with the data processing system. One of the techniques used to increase the quantity of data which can be stored in a given space is known as phase encoding. In phase encoding data bits are represented by specific changes in voltage level. For example, a binary zero may be represented consistently by an increasing signal voltage, and a binary one may be represented consistently by a decreasing signal voltage. When a series of binary ones or a series of binary zeros is recorded, it is necessary to include a "phase bit" between the binary ones or between the binary zeros. The phase bit may be used to synchronize the data with a variable frequency oscillator in a data recovery portion of the controller being used to direct the operations of the particular magnetic storage device. This synchronization enables the data recovery portion of the controller to read the data only at those times when signal voltage level changes represent real data, so that noise voltages which may occur at other times will be screened out and not be registered as real data.

Data is stored in a magnetic tape subsystem in "blocks" with each block of data comprising a preamble portion, a data portion, and a postamble portion, The preamble is used to synchronize the variable frequency oscillator in the data recovery portion of the magnetic tape subsystem controller. The oscillator in turn is used to enable the tape subsystem controller to sample or read each of the data pulses near the middle of the pulse so that noise and other interference will not introduce error signals into the data processing system. According to the embodiment of the invention described herein, the magnetic tape subsystem stores and retrieves data in which the preamble and postamble data portions each comprise a series of 80 pulses. The 80 pulses of the preamble are utilized to adjust the oscillator so that it will be in exact synchronization with the data pulses being detected. The data envelope detector of the present invention is used to sense the presence of data as it is written onto or read from the magnetic tape, and it generates an output signal which turns on a certain time after the preamble portion has been detected and turns off after an equivalent amount of time has expired after the end of the postamble has been detected. The output signal generated by the data envelope detector is used by other circuitry for performing various control functions within the tape subsystem controller. Reference may be had to U.S. Pat. No. 3,832,684, assigned to the assignee of the present invention, for an example of such control circuitry.

A known prior art data envelope detector is described in U.S. Pat. No. 3,810,233, assigned to the assignee of the present invention, wherein an output signal is generated in every case at a fixed time (i.e., after a fixed number of data pulses) after detection of the preamble, and wherein the output signal returns to zero at an equivalent amount of time after detection of the end of the postamble. While the operation of the prior art envelope detector is satisfactory under nearly all circumferences, it is desirable to have an envelope detector in which the time delay between detection of the preamble and generation of an output signal is variable depending upon the nature of the data transfer operation.

SUMMARY OF THE INVENTION

It is therefore an object of the present invention to provide an improved data envelope detector for detecting phase encoded data.

It is also an object of the present invention to provide an improved data envelope detector for detecting phase encoded data being transferred to or from magnetic tape in a magnetic tape subsystem.

It is a further object of the present invention to provide a programmable data envelope detector for detecting the presence of phase encoded data, in which the time period between the initial detection of such data and the generation of an output signal by the detector may be varied according to the type of data transfer operation.

These and other objects of the present invention are achieved in accordance with a preferred embodiment of the invention by providing a microprogrammable control store, a decoder for decoding microinstructions received from the control store, a data pulse detector, a three-count up-down counter, two multicount four-bit up-down counters, a compare circuit, and a latch circuit. Appropriate microinstructions corresponding to particular data transfer operations, such as "read" and "write" operations, may be stored in the control store and may provide for different time periods for triggering an output signal from the latch circuit after the detection of an initial pulse of data in the data envelope. The number of pulses specified by a particular microinstruction for a given data transfer operation is supplied as one input to the compare circuit, and the actual number of data pulses received at any given moment is supplied as another series of inputs to the compare circuit. When the compare circuit indicates a match, the latch circuit is set on the next data pulse received and generates the desired output signal. When data is no longer detected for a period of time equal to that between the detection of the first data pulse and the setting of the latch circuit the latch circuit is reset and generates a low output signal.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

FIG. 2 illustrates various waveforms at different portions of the circuit schematic of FIG. 1.

DETAILED DESCRIPTION OF THE INVENTION

Figure 1:
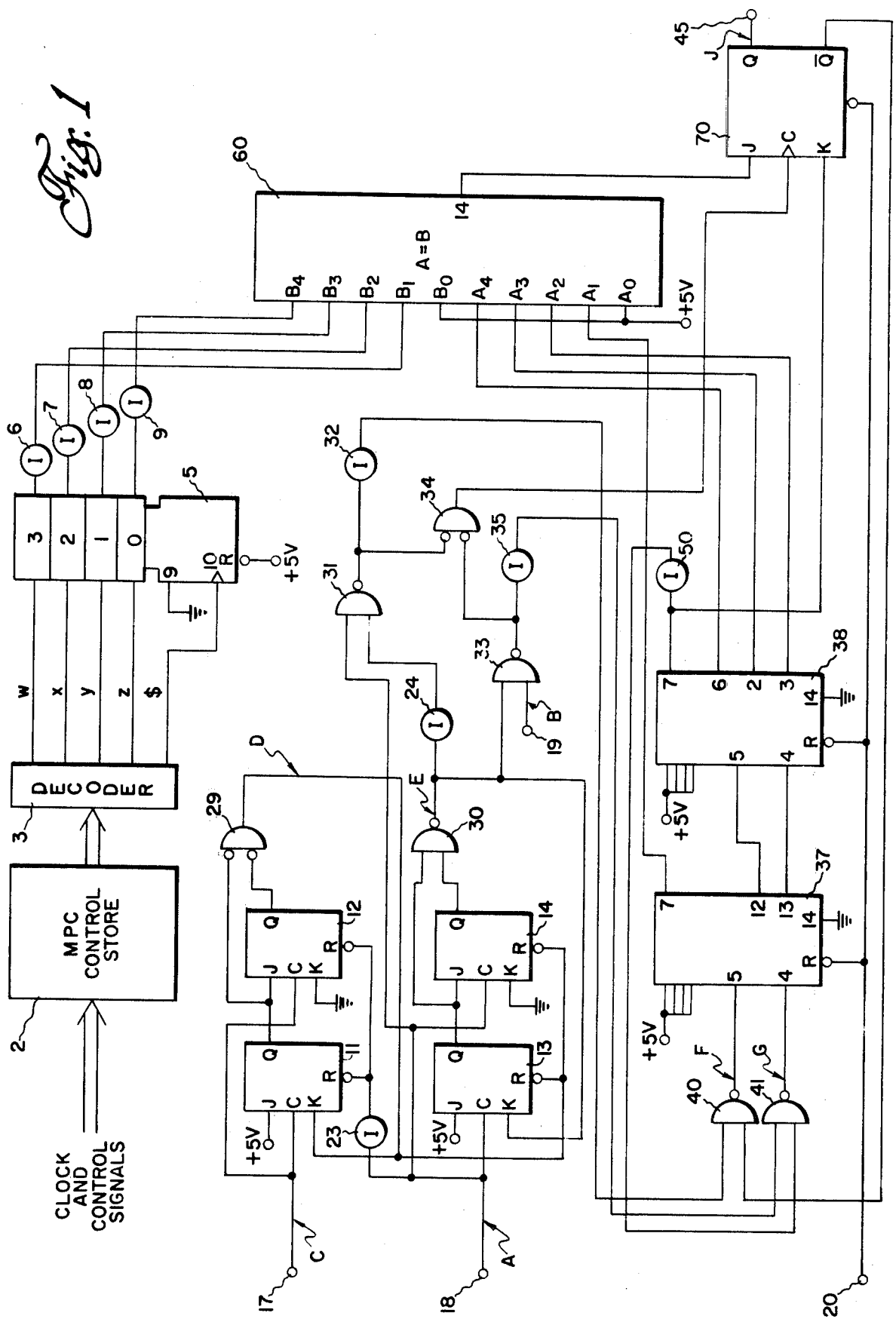
FIG. 1 is a circuit schematic of a preferred embodiment of the present invention.

The envelope detector shown in FIG. 1 includes a plurality of JK flip-flops 11-14, a plurality of inverters 23-26, a plurality of gates and a pair of up-down counters 37 and 38. The JK flip-flops are circuits adapted to operate in either one of two stable states and to transfer from the state in which they are operating to the other stable state upon the application of a trigger signal thereto. In one state of operation the JK flip-flop represents a binary one (1-state) and in the other state it represents a binary zero (0-state). The three leads entering the left-hand side of the flip-flop symbol, for example, flip-flop 11 provide the required trigger signals. The upper lead, the J lead provides the set signal, the lower lead, the K lead, provides the reset signal and the center lead provides the triggering signal. When the set input signal on the J lead is positive and the reset signal on the K lead has a low value a trigger signal on the C lead causes the flip-flop to change to the one state, if it is not already in the 1-state. When the reset signal is positive and the set signal zero, a positive trigger signal causes the flip-flop to transfer to the 0-state if it is not already in the 0-state. The R lead entering the bottom of the flip-flop provides reset signals. When a zero voltage potential is applied to the R lead, the flip-flop resets to the 0-state and remains in the 0-state as long as the zero voltage potential remains on the R lead irrespective of the signals on the J, C and K leads. The Q output lead leaving the right-hand side of the flip-flop delivers a one output signal of the flip-flop.

Counters 37 and 38 are synchronous 4-bit up-down counters such as the Ser. No. 74,193 which is available from several manufacturers. Details of the operation of this counter may be found in "The Integrated Circuit Catalog for Design Engineers," first edition, by Texas Instruments, Dallas, Texas, The Ser. No. 74,193 counts up when pulses are applied to input lead No. 5 while a positive voltage is applied to input lead No. 4. The Ser. No. 74,193 counts down when pulses are applied to input lead No. 4 while a positive voltage is applied to input lead No. 5. Leads No. 2, 3, 6, and 7 of the Ser. No. 74,193 are counter output leads, while lead 12 is a carry lead and lead 13 is a borrow lead. Lead 3 is the count-of-1 output; lead 2 is the count-of-2 output; lead 6 is the count-of-4 output; and lead 7 is the count-of-8 output. Counters 37 and 38 generate ones at all output leads when loaded by a negative voltage strobe at their R input terminals.

The NAND-gates 30, 31, 33, 40 and 41 disclosed in FIG. 1 provide a logical NAND function for input logic signals applied to its input leads. In the system disclosed, a binary one is represented by a positive signal, the NAND-gate provides an output signal of approximately zero volts representing a binary zero, when and only when all of the input signals applied to its input leads are positive and represent binary ones. Conversely, the NAND-gate provides a positive output signal representing a binary one when any one or more of the input signals applied thereto represent binary zeros.

The inverters 6-9, 23, 24, 32, 35, and 50 each provide the logical operation of inversion for an input signal applied thereto. The inverter provides a positive output signal representing a binary one when the input signal applied thereto has a low value representing a binary zero. Conversely, the inverter provides an output signal representing a binary zero when the input signal represents a binary one. Gates 29 and 34 provide an output signal representing a binary one when either of the input signals represennt binary zeros. When both of the input signals applied thereto represents a binary one the output signal represents a binary zero.

The present invention may be located in a peripheral controller. In the preferred embodiment it is located in a microprogrammable peripheral controller (MPC) of the type described in U.S. Pat. Nos. 3,742,457 and 3,753,236, assigned to the same assignee as the present invention. The MPC control store 2 contains sets of firmware microinstructions for providing specialized programs for various types of data transfer operations and peripheral device control operations. Decoder 3 decodes individual microinstructions and generates a plurality of control signals $w-z$ which represent specific times between the detection of a first data pulse and the triggering of the output signal, depending upon the particular coding of signals $w-z$. Decoder 3 also generates a clock signal $ at the specific time when decoder outputs $w-z$ are written into the read/write memory 5.

Different specific microinstructions in MPC control store 2 are coded to specify different time delays between the detection of the first pulse of the preamble and the generation of an output signal, depending upon the type of data transfer operation. For example, when the magnetic tape subsystem is operating in a "write" mode it is assumed that the data to be written onto the tape does not contain distortions of the type typically encountered in tape-recorded data, and consequently the oscillator in the data recovery portion of the tape subsystem controller can be expected to synchronize fairly rapidly with the preamble pulses. Thus, in the "write" mode, the firmware in the MPC control store is encoded so as to cause the output from the programmable envelope detector to be generated after 29 preamble pulses. On the other hand, when the data transfer operation is a "read" and data is being transferred from magnetic tape to the data recovery portion of the magnetic tape subsystem controller, it is expected that the oscillator will require more time in which to synchronize with the preamble pulses, and thus the firmware is encoded to generate an output signal from the programmable envelope detector after 61 preamble pulses have been detected. On "reread" operations a fewer number of preamble pulses can be used to trigger the envelope detector output, as in the case, for example, where the end portion of a preamble has been destroyed for some reason.

The read/write memory 5 is a four-bit JG KG DC shift register operated as a parallel-in/parallel-out one-bit read/write memory. It is commercially available in the form of a Fairchild Series 9300. Read/write memory 5 writes the $w-z$ signals into portions 3-0, respectively, when it receives a strobe pulse $ at its input 10 from the decoder 3, and it continuously generates output signals from portions 3-0 corresponding to the values which $w-z$ had at the time the $ signal was received until such time as a new group of signals $w-z$ may be clocked in.

The comparator 60 is a five-bit compare circuit commercially available as a Fairchild Series 9324. It receives two five-bit groups of signals and generates a positive output signal from output lead 14 when a match occurs between the two pairs of five-bit signal groups. The latching circuit 70 is a JK flip-flop identical to flip-flops 11-14 and is commercially available as a Texas Instruments Series 74H106.

OPERATION OF THE PREFERRED EMBODIMENT

The operation of the envelope detector shown in FIG. 1 will now be described in connection with the voltage wave forms shown in FIG. 2. The date pulses of waveform A of FIG. 2 are applied to signal input terminal 18 of the envelope detector of FIG. 1 and the timing or clock pulses of waveform B are applied to signal input terminal 19. The frequency of the timing pulses of waveform B is divided by two to generate waveform C, which is applied to signal input terminal 17 of FIG. 1. Waveform C is also inverted with respect to waveform B. A reset signal may be applied to signal input terminal 20 of FIG. 1 to preset the up-down counters 37 and 38 and latching circuit 70 so that the voltages from the output leads of both counter 37 and 38 are high prior to the receipt of any data pulses on the input terminal 18 of FIG. 1 and the output of latching circuit 70 is low.

Waveform A of FIG. 2 represents the dat input signals which include a premable comprising a plurality of positive pulses which may be followed by data and then by a postamble. A portion of the preamble is shown in the waveform A; however, the data portion of the waveform is not shown. Waveform A represents the output of an edge detector circuit (not shown) which generates a positive output pulse at every transition of the data signal being transmitted to or received from the magnetic tape. The output of the edge detector is applied to terminal 18 of the data envelope detector. If, for example, the preamble comprises a series of 40 zeros the edge detector will generate a series of 80 positive pulses at terminal 18. Waveform B illustrates timing pulses from the oscillator which is applied to input terminal 19. The same oscillator signal is inverted and divided by two annd applied to signal input terminal 17 as waveform C.

The leading edge of the first pulse of waveform A at input terminal 18 is inverted by inverter 23 and applied to the reset lead of flip-flops 11 and 12 at time $t_1$. This first pulse resets flip-flops 11 and 12 so that the voltage on the Q output leads of flip-flops 11 and 12 is low thereby causing gate 29 to provide a positive value of output voltage as indicated by the rise in voltage level in signal D shown in FIG. 2. This positive value of output voltage from gate 29 removes the negative reset voltage from flip-flops 13 and 14 so that the trailing edge of the first pulse of waveform A causes flip-flop 13 to be set. When flip-flop 13 is set the positive voltage from the Q output lead of flip-flop 13 is applied to the J input lead of flip-flop 14 and to the upper input lead of NAND-gate 30. The positive voltage on the J input lead of flip-flop 14 causes the next pulse from terminal 18 to set flip-flop 14. Since the K input lead of flip-flop 14 is grounded the flip-flop 14 cannot be reset and is latched in a set condition. This second pulse also causes flip-flop 13 to be reset. The third pulse at input terminal 18 causes flip-flop 13 to be set so that a positive voltage from the Q output lead is applied to the upper lead of the NAND-gate 30. At this time flip-flops 13 and 14 are both set so that positive voltages are applied to both of the input leads of NAND-gate 30 causing NAND-gate 30 to provide a low value of voltage on the output lead, as shown by signal E switching to a low signal level in FIG. 2. This low value of voltage is applied to the K input lead of flip-flop 13 so that flip-flop 13 cannot be reset and is latched in a set condition. The low output voltage of NAND-gate 30 is inverted by inverter 24 and applied to the lower lead of NAND-gate 31. The fourth positive pulse from input terminal 18 and subsequent pulses are gated through gate 31 which has been enabled and are applied to the upper input lead of gate 34. They are also inverted by inverter 32 and applied to the upper input lead of NAND-gate 40.

NAND-gate 33 is disabled by a low voltage applied to its upper terminal and outputs a positive voltage to the lower lead of gate 34. gate 34 in turn generates a positive voltage value and applies it to the C input of latching circuit 70 whenever it receives a low voltage at its upper terminal (i.e., with the occurrence of each data pulse). The constant positive voltage generated by NAND-gate 33 is also inverted by inverter 35 and transmitted as a constant low voltage value to the upper input of NAND-gate 41.

Because latching circuit 70 was reset prior to receipt of any data pulses from terminal 18, its Q output is at a constant positive voltage which is applied to the lower input of NAND-gate 40. When the fourth data pulse has been transmitted to the upper lead of NAND-gate 31, a negative voltage signal is transmitted on the falling edge of the fourth data pulse to the upper lead of NAND-gate 40, which consequently generates a positive voltage pulse (see rise in signal F between data pulses 4 and 5) and applies it to input lead 5 of counter 37 causing counter 37 to count upward one increment. Since counters 37 and 38 were initially loaded by a negative voltage pulse at their R terminals to generate positive voltage signals at each of their output terminals, the advancing of counter 37 by one increment generates a carry signal from it output lead 12 to the count-up input lead 5 of counter 38. The outputs of counters 37 and 38, all go to zero.

Each of the falling edges of subsequent data pulses from input terminal 18 causes counter 37 to count upward. When counter 37 has received sixteen pulses its four output terminals 7, 6, 2, and 3 (only 7 is shown in FIG. 1) are all high. On the seventeenth pulse to counter 37 its four outputs go low, and another carry signal is generated by its carry output 12. The carry signal is applied to the count-up input 5 of counter 38, which consequently generates a high signal over output lead 3 representing a count of one. The signal is transmitted as a one to lead $A_2$ of comparator 60.

Counter 37 continues to count upward as data pulses are gated to its count-up lead 5 from terminal 18 through NAND-gate 40, generating a carry output to the count-up input 5 of counter 38 every time counter 37 completes a cycle of sixteen counts. When the $A_1$-$A_4$ inputs to comparator match the $B_1$-$B_4$ inputs decoded from the MPC control store 2, corresponding to a particularly designated count of data pulses (somewhere between 4 and 80 pulses), comparator 60 generates a high signal from its output lead 14 to the J input of latch circuit 70. In the example of the operation of the present invention illustrated in FIG. 2, the $B_1$-$B_4$ inputs represent a count of 28, corresponding to a "write" operation. The 29th data signal received at terminal 18 sets latch circuit 70 by apply a one to its C input through NAND-gate 31 and gate 34, causing it to generate Q high and Q low. The high signal from the Q output of latch 70 is transmitted to output terminal 45 (see rise in signal J corresponding to data pulse 29).

Counters 37 and 38 are disabled from further upward counting at this time, since the low signal from Q of latch 70 is applied to the lower lead of NAND-gate 40, thereby temporarily maintaining the output of such gate in a high state (see portion of signal F corresponding to data pulse 29).

Latching circuit 70 is latched until the counters 37 and 38 count down. As long as data pulses continue to be received on the input terminal 18 the counters will not count down, and the output voltage on terminal 45 remains positive. During this time the data pulses from input terminal 18 keep the flip-flops 11 and 12 reset so that the timing pulses on input terminal 17 do not affect the setting of flip-flops 11 and 12.

When pulses are no long received on input terminal 18 as, for example, at time $t_{101}$ of FIG. 2, the pulses on input terminal 17 cause flip-flops 11 and 12 to start the downward count. The first pulse at input terminal 17 causes flip-flop 11 to be set and to provide a positive voltage to the J input lead of flip-flop 12. The positive voltage on the J input lead of flip-flop 12 and the second pulse on the C input lead causes flip-flop 12 to be set and to provide a positive voltage to the lower lead of gate 29. Since the K input lead of flip-flop 12 is grounded, flip-flop 12 cannot be reset and is latched in a set condition. The second pulse also resets flip-flop 11. The third pulse on terminal 17 causes flip-flop 11 to be set so that a positive voltage from the Q output lead is applied to the upper lead of gate 29. At this time flip-flops 11 and 12 are both set so that positive voltages are applied to both of the input leads of gate 29 causing gate 29 to provide a low value of voltage (signal D, FIG. 2) to the K input lead of flip-flop 11, latching it in a set condition. The low output from gate 29 also causes flip-flops 13 and 14 to generate Q low outputs to the upper and lower input leads of NAND-gate 30, which in turn generates a high output to the upper input gate of NAND-gate 33, enabling same. Thereafter clock pulses received from terminal 19 are gated through gates 33 and 41 to the count-down input 4 of counter 37, causing it to start counting in a downward direction (signal G low-to-high transitions correspond to falling edges of clock pulses beginning with clock pulse 105). When counters 37 and 38 have counted down a number of increments equal to that which they had previously counted up, output lead 7 of counter 38 generates a high signal, which is inverted by inverter 50 and applied as a low signal to the lower input of NAND-gate 41, thus disabling further count-down pulses through such gates (signal G remains high after falling edge of clock pulse 129). The high signal generated from output lead 7 of counter 38 is also applied to the K input of latching circuit 70. Since the J input to same is low, latching circuit 70 resets, and the output voltage on output terminal 45 is low (see fall in signal J corresponding to clock pulse 129).

It will be apparent to those skilled in the art that the disclosed Programmable Envelope Detector may be modified in numerous ways and may assume many embodiments other than the preferred form specifically set out and described above. Accordingly it is intended by the appended claims to cover all modifications of the invention which fall within the true spirit and scope of the invention.

What is claimed is:

1. Apparatus for detecting the presence of a data envelope containing a plurality of preamble pulses, a plurality of data pulses, and a plurality of postamble pulses, for use with a source of pulses and a source of timing signals, said pulses and said timing signals being in substantial synchronization with one another, said apparatus including means responsive to said pulses and to said timing signals for counting said pulses and said timing signals, said counting means generating a first signal indicative of the number of preamble pulses which have been counted and generating a second signal after a predetermined number of timing signals have been counted subsequent to counting the last pulse in said postamble;

a programmable store for storing a plurality of program instructions including at least one instruction indicating a predetermined number of preamble pulses;

means for decoding said at least one instruction and for generating a decoded signal indicating said predetermined number of preamble pulses;

means for comparing said first signal and said decoded signal and generating a compare signal when said first signal and said decoded signal are equal;

latching means responsive to said compare signal from said comparing means to said second signal from said counting means, said latching means generating a first output signal upon receipt of said compare signal and generating a second output signal upon receipt of said second signal.

2. Apparatus for detecting the presence of a data envelope containing a predetermined number of preamble pulses, a plurality of data pulses, and a predetermined number of postamble pulses, for use with a source of pulses, a source of first timing signals, and a source of second timing signals, said pulses and said first timing signals being in substantial synchronization with one another, said first timing signals having twice the frequency of said second timing signals, said apparatus including a three-count serial up-down counter responsive to said source of pulses and to said sources of first and second timing signals, said three-count generating a first signal when three of said preamble pulses have been counted and generating a second signal when five of said first timing signals have been counted after the last pulse in said postamble has been counted;

first and second multicount up-down counters each having a count-up input lead and a count-down lead, said first multicount counter further comprising a carry output lead connected to the count-up input lead of said second multicount counter, a borrow output lead connected to the count-down input lead of said second multicount counter, and a further output lead representing a binary count-of-8, said second multicount counter further comprising a first output lead representing a binary count-of-1, a second output lead representing a binary count-of-2, a third output lead representing a binary count-of-4, and a fourth output lead representing a binary count-of-8;

a programmable store for storing a plurality of program instructions, at least one of said instructions representing a predetermined number of preamble pulses in said data envelope;

means for decoding said at least one instruction and for generating a strobe signal and a four-bit decoded signal representing said predetermined number of preamble pulses;

a parallel-in, parallel-out one-bit read/write memory responsive to said decoding means for storing said decoded four-bit signal when activated by said strobe signal and for continuously generating said four-bit decoded signal over four output leads;

at least one potential source;

a binary comparison circuit comprising first and second five-bit groups of input leads and an output lead, the lowest order lead of each of said groups being connected to said at least one potential source, the remaining four input leads of said first group being connected to said four output leads of said read/write memory, the second lowest order lead of said second group being connected to said count-of-8 output lead of said first multicount counter, the third lowest order lead of said group being connected to said count-of-1 output lead of said second multicount counter, the fourth lowest order lead of said second group being connected to said count-of-2 output lead of said second multicount counter, and the highest order lead of said second group being connected to said count-of-4 output lead of said second multicount counter;

a latching circuit comprising a J/K flip-flop having J, K, and C input leads, and Q and Q output leads, said J input lead being connected to the output lead of said comparison circuit, said K input lead being connected to said fourth output lead of said second multicount counter, said C input lead being responsive to said source of first timing signals;

first logic means responsive to said first signal from said three-count counter, to said source of pulses, and to said Q output lead of said J/K flip-flop, said first logic means having an output connected to said count-up lead of said first multicount counter; and second logic means responsive to said second output signal from said three-count counter, to said source of first timing signals, and to said fourth output lead of said second multicount counter, said second logic means having an output lead connected to the count-down input lead of said first multicount counter.

* * * * *